United States Patent [19]
Cadwallader et al.

[11] Patent Number: 6,058,592
[45] Date of Patent: May 9, 2000

[54] LOCATOR ACTUATION METHOD

[75] Inventors: Robert H. Cadwallader, Clinton Corners; Michael J. Fisher, Poughkeepsie; Thomas Morrison, Pleasant Valley, all of N.Y.

[73] Assignee: International Business Machines Corporation, Armonk, N.Y.

[21] Appl. No.: 09/086,046

[22] Filed: May 28, 1998

Related U.S. Application Data

[62] Division of application No. 08/840,833, Apr. 17, 1997, Pat. No. 5,873,566.

[51] Int. Cl.$^7$ ..................................................... B23Q 3/08
[52] U.S. Cl. .............................. 29/559; 269/34; 269/228; 269/229; 269/902
[58] Field of Search .................................. 269/20, 25, 26, 269/32, 33, 34, 228, 229, 254 R, 254 CS, 902; 29/559

[56] References Cited

U.S. PATENT DOCUMENTS

| | | |
|---|---|---|
| 2,341,602 | 2/1944 | Dewey . |
| 2,664,860 | 1/1954 | Levetus . |
| 2,966,721 | 1/1961 | Bordignon et al. . |
| 3,032,331 | 5/1962 | Doty et al. . |
| 4,139,189 | 2/1979 | Wietrzyk . |
| 4,436,385 | 3/1984 | Fisher et al. . |
| 4,438,984 | 3/1984 | Leppala . |

*Primary Examiner*—Robert C. Watson
*Attorney, Agent, or Firm*—Steven Capella

[57] ABSTRACT

An apparatus for locating a workpiece on a processing surface includes a first locator arm assembly, a second locator arm assembly, and a pivotal member. The first locator arm assembly includes a first surface disposed for lateral movement and mating engagement with a first portion of the workpiece. The second locator arm assembly includes a second surface disposed for lateral movement parallel to the first surface, the second surface further for mating engagement with a second, opposite side, portion of the workpiece. Lastly, pivotal member is disposed for pivotal movement about a pivot point and symmetrically coupled, with a zero tolerance buildup, between the first locator arm assembly and the second locator arm assembly for inducing an equal but opposite lateral movement in the first and second mating engagement surfaces of the first and second locator arm assemblies, respectively, whereby the workpiece is accurately located on the processing surface between respective first and second mating engagement surfaces as the surfaces are moved towards one another.

8 Claims, 6 Drawing Sheets

LOCATOR ACTUATION METHOD

CROSS-REFERENCE TO CONCEDING APPLICATIONS

This application is a divisional of U.S. patent application Ser. No. 08/840,833, filed Apr. 17, 1997, now U.S. Pat. No. 5,873,566.

Copending U.S. patent applications Ser. No. 08/840,835, filed concurrently herewith, entitled "Substrate Tester Method and Apparatus Having Rotatable and Infinitely Adjustable Locator Jaws", (Attorney docket FI9-97-021) describes a locator actuation method and apparatus for locating and positioning a substrate during manufacture and testing thereof; U.S. Ser. No. 08/840,836, filed concurrently herewith, entitled "Substrate Tester Having Shorting Pad Actuator Method and Apparatus", (Attorney docket FI9-97-022), describes a substrate tester; and U.S. Ser. No. 08/840,834, filed concurrently herewith, entitled "Substrate Tester Location Clamping, Sensing, and Contacting Method and Apparatus", (Attorney docket FI9-97-023) describes a glass ceramic substrate tester, all assigned to the assignee of the present invention, the disclosures of which are hereby incorporated by reference into the present application.

BACKGROUND OF THE INVENTION

1. Field of the Invention

This invention relates generally to a method and apparatus for locating and positioning a workpiece on a surface and, more particularly, to a locator actuation method and apparatus for locating and positioning of a multilayer ceramic substrate (MLC) during a manufacture and testing thereof.

2. Discussion of the Related Art

Substrate testers are known in the art for performing network integrity tests on substrates, such as multilayer ceramic substrates (MLCs). A substrate refers to a packaging unit that provides an interface between a semiconductor chip (e.g. a very large scale integrated (VLSI) circuit chip) and a higher level packaging unit (e.g., a printed circuit board). A network is generally defined by a set of one or more electrically connected common points on a substrate. Networks are used to distribute electrical signals and voltages externally and/or internally about the substrate in accordance with the requirements of a particular integrated circuit chip. Substrate testers are used during substrate manufacturing to guarantee that there are no process or design created defects (corresponding to opens or shorts) on a particular substrate being tested. Typically, a substrate tester performs a test using a particular contacting scheme. A test matrix scanner is then used to provide an electrical stimulus on each point of the networks contacted by the contacting scheme and then systematically scans the remaining points in the test matrix to guarantee all desired connections exist (opens test) and that there are no unwanted connections (shorts), as the case may be.

In current manufacturing techniques of MLC substrates, there is a need to improve the accuracy and cost structure of substrate locators in an effort to satisfy more stringent manufacturing process requirements. Conventional substrate locators require many moving parts which disadvantageously contribute to tolerance build-ups, inaccuracies, and thus higher manufacturing costs. Conventional substrate locators also use many high precision parts, which are not performance efficient or cost efficient for meeting the current manufacturing requirements. For example, multi-cam drive assemblies are exceedingly costly in terms of their use in the manufacturing process.

Current state of the art substrate locators include a number of moving parts, which may include parts such as precision cam slots, cam followers, gears, etc. The moving parts contribute to a build up of tolerances. This build up of tolerances prevents a precise and absolute locating and positioning by the locator with respect to a centering of the substrate parts over or under a workstation, wherein the workstation requires extreme positioning accuracy and repeatability. The workstation may also include a high speed substrate tester (HSST) which has traditionally been characteristically large and slow.

Features on MLC substrates are very small and in close proximity to one another. For example, any one particular MLC substrate may include more than one thousand pin or pad connections in an area on the order of one-quarter square inch of space, as can be realized in the current state of art for MLC substrates. It is thus very critical to align the substrate parts in a repeatable manner, for example, with respect to a testing and a placement of test contacts, or other processing and manufacturing options, such as chip placement, discrete wiring, etc.

U.S. Pat. No. 4,436,385, issued Mar. 13, 1984 and entitled "Specimen Holder for Inverted Microscopes" discloses a specimen holder having a wide range of capability for replaceably accepting and holding any one of a variety of sizes and shapes of specimens. In one embodiment, the specimen holder includes a release and clamp mechanism for one-handed operation. A series of interconnected mechanical links are disposed between a first plate and a second plate. The interconnected links pivot with respect to each other at their respective interconnections. Furthermore, one of the interconnected links includes a pin and slot connection to one of the plates, which further pivots about a pivot point for moving the plates towards each other or away from one another via the multiple interconnected links. However, a given amount of movement in one direction by the pin and slot connected linkage does not produce a corresponding same amount of movement of the corresponding connected plate when the pin and slot connected linkage is moved the same given amount in an opposite direction. Accurate determinable positioning is thus not attainable. This is because the specimen holder suffers from an undesirable buildup of tolerances as a result of the multiple interconnected linkages and the slot and pin connection. Non-uniform plate movement further results in a different centerline location for each successive clamped specimen. In addition, not all of the components of the specimen holder are in tension during a clamping operation, thus the specimen being clamped is subject to a non-uniform clamping force and possible mis-positioning.

It would thus be desirable to provide a locator which can accurately locate and repeatably position MLC substrates with respect to a centerline location during a manufacturing process, and furthermore, reduce the manufacturing costs of producing the same.

SUMMARY OF THE INVENTION

An object of the present invention is to provide substrate locator which addresses current manufacturing requirements in terms of repeatability, accuracy, and cost efficiency and overcomes problems in the art as discussed herein above.

Another object of the present invention is to more accurately locate and position substrates during a manufacturing process and to reduce manufacturing costs overall.

According to the present invention, an apparatus for locating a workpiece on a processing surface includes a first locator arm assembly having a first surface disposed for lateral movement and mating engagement with a first portion of the workpiece. A second locator arm assembly includes a second surface disposed for lateral movement parallel to the first surface. The second surface is for mating engagement with a second, opposite side, portion of the workpiece. Lastly, a pivotal means is disposed for pivotal movement about a pivot point and symmetrically coupled, with a zero tolerance buildup, between the first locator arm assembly and the second locator arm assembly. The pivotal means is for inducing an equal but opposite lateral movement in the first and second mating engagement surfaces of the first and second locator arm assemblies, respectively, whereby the workpiece is accurately located on the processing surface between respective first and second mating engagement surfaces as the surfaces are moved towards one another.

Further in accordance with the present invention, a method of locating a workpiece on a processing surface includes the steps of providing a first locator arm assembly having a first surface disposed for lateral movement and mating engagement with a first portion of the workpiece. A second locator arm assembly having a second surface disposed for lateral movement parallel to the first surface is provided, the second surface further for mating engagement with a second, opposite side, portion of the workpiece. Lastly, a pivotal means is provided which is disposed for pivotal movement about a pivot point and symmetrically coupled, with a zero tolerance buildup, between the first locator arm assembly and the second locator arm assembly for inducing an equal but opposite lateral movement in the first and second mating engagement surfaces of the first and second locator arm assemblies, respectively. As a result, the workpiece is accurately located on the processing surface between respective first and second mating engagement surfaces as the surfaces are moved towards one another.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
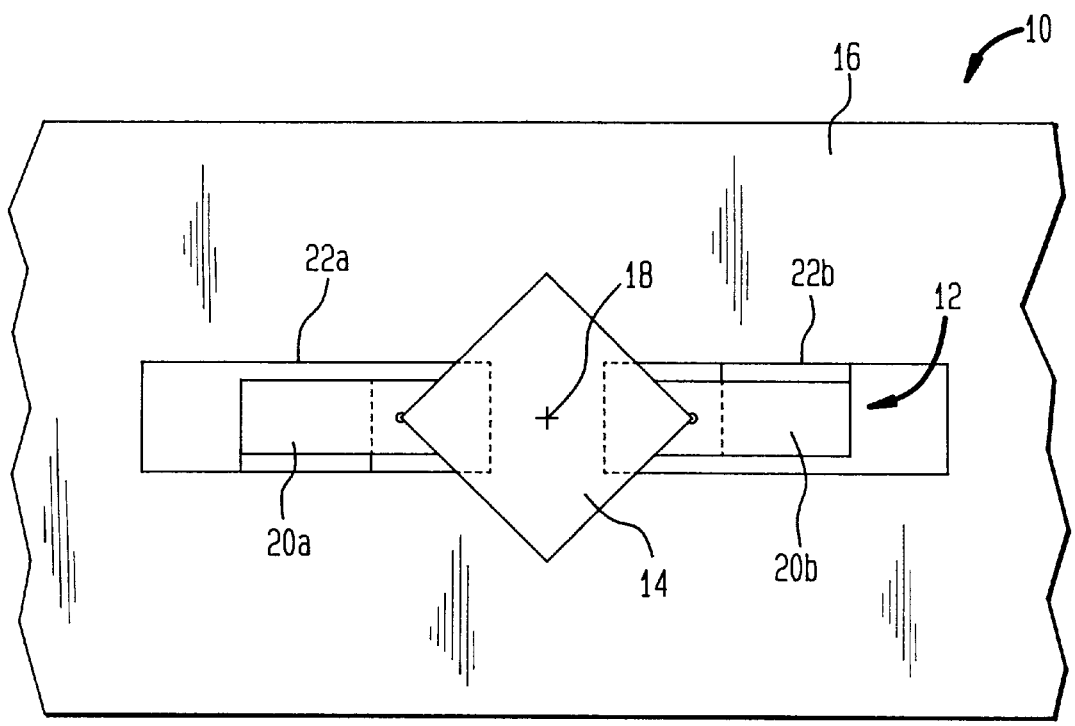
FIG. 1 shows a top view of an MLC substrate having been positioned upon a processing surface by the locator according to the present invention.

Turning now to the FIG. 1, a top view of a substrate processing apparatus 10 according to one embodiment of the present invention is shown. Substrate processing apparatus 10 includes a locator apparatus 12 for locating a substrate 14, for example, an MLC substrate, on a processing surface 16 during a processing operation. Processing surface 16 may include, for example, any suitable platen or other surface. A center of the substrate 14 can be accurately and repeatably positioned and located over a desired nesting point 18 on the processing surface 16, regardless of any variations in the size of the MLC substrate being located upon the processing surface 16. As shown, a pair of locator jaws 20a and 20b of the locator apparatus 12 according to the present invention locate the substrate 14 from opposite side edges, and more particularly, opposite corner edges thereof. The pair of locator jaws 20a and 20b further extend through apertures 22a and 22b, respectively, in the processing surface 16 and above the surface in a vertical direction by an amount sufficient for engaging substrate 14. Further details of the locator apparatus 12 shall be described herein below.

Figure 2:
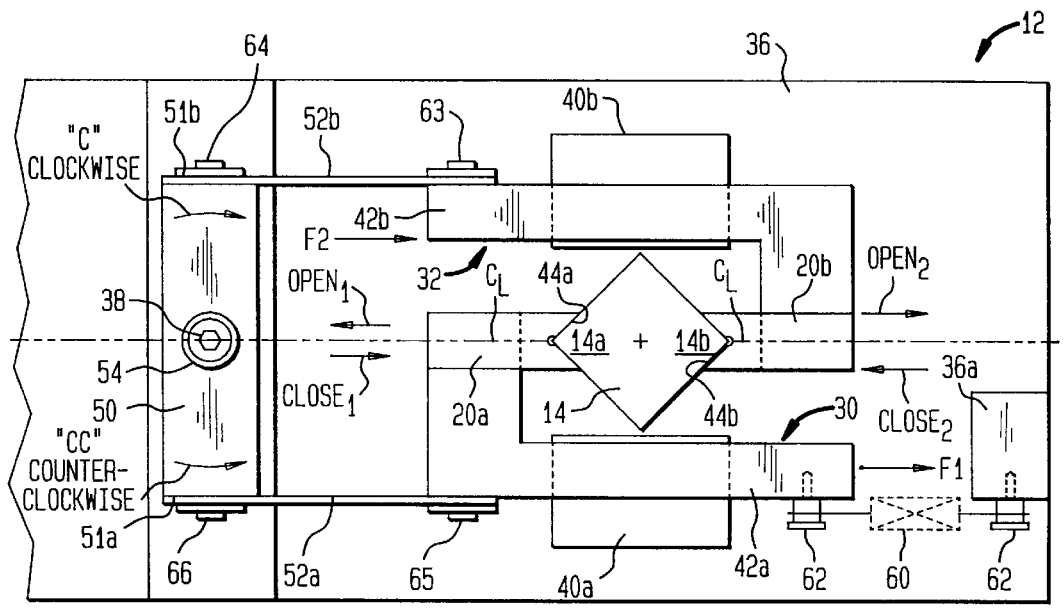
FIG. 2 illustrates a top view of the present invention in accordance with a first embodiment.
Figure 3:
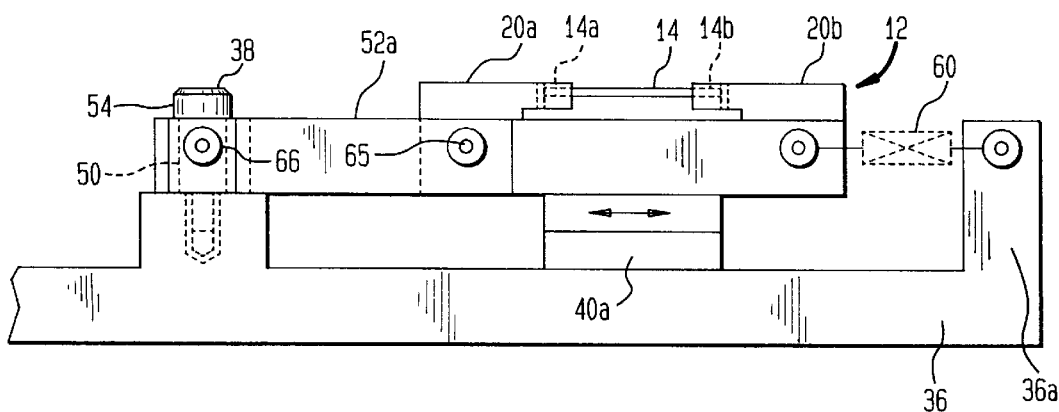
FIG. 3 illustrates a side view of the embodiment of the present invention as shown in FIG. 2.

Turning now to FIGS. 2 and 3, which exemplify a top view and side view, respectively, of the locator apparatus 12, locator apparatus 12 includes a first locator arm assembly 30, a second locator arm assembly 32, and a pivotal means 34 disposed for pivotal movement about a pivot point 38 and symmetrically coupled, with a zero tolerance buildup, between the first locator arm assembly 30 and the second locator arm assembly 32. First locator arm assembly 30, second locator arm assembly 32, and pivotal means 34 can be mounted upon a base plate 36 is a desired spatial relationship and/or configuration, for example, as shown and discussed further herein below.

First locator arm assembly 30 includes a first linear slide mechanism 40a having a first locator arm 42a slidably mounted thereon for translational movement. The first locator arm 42a has a first surface 44a disposed for lateral movement and mating engagement with a first portion 14a of the substrate 14. Second locator arm assembly 32 includes a second linear slide mechanism 40b having a second locator arm 42b slidably mounted thereon for translational movement, the translational movement being parallel to the translational movement of the first locator arm 42a. The second locator arm 42b has a second surface 44b which is disposed for lateral movement parallel to the first surface 44a. The second surface 44b is further for mating engagement with a second, opposite side, portion 14b of the substrate 14. Preferably, the first and second mating engagement surfaces 44a and 44b, respectively, each include a square or right angle surface, hereinafter referred to as a V-shape engagement surface. In addition, the V-shape engagement surfaces each include a relief bore at the bottom of the V-shape for receiving a corner of the substrate or workpiece therein during a locating of the substrate or workpiece to insure side contact.

Linear slide mechanisms 40a and 40b, preferably include micro frictionless precision linear slides, such as those commercially available by Schneeburger of Bedford, Mass, U.S.A., for example, Model #ND3-105.60. Linear slide mechanisms 40a and 40b are mounted opposite one another, with their respective sliding motion running parallel to each other. Furthermore, slide mechanisms 40a and 40b are mounted to base plate 36 by suitable fasteners.

Referring still to FIGS. 2 and 3, pivotal means 34 is disposed for pivotal movement on base plate 36 about a pivot point 38. Pivotal means 34 is further symmetrically coupled, with a zero tolerance buildup, between the first locator arm assembly 30 and the second locator arm assembly 32 for inducing an equal but opposite lateral movement in the first and second mating engagement surfaces 44a and 44b of the first and second locator arm assemblies 30 and 32, respectively. Preferably, pivotal means 34 includes a pivotal arm member or block 50 symmetrically coupled to the first and second locator arms 42a and 42b using flat springs 52a and 52b, respectively.

Pivotal arm member 50 preferably includes a precision bearing 54 for pivotal movement about pivot point 38. Precision bearing 54 includes, for example, a precision bearing such as a shaft and bushing with a close running fit. The precision bearing creates a minimal tolerance between pivot point 38 and pivotal arm member 50 in accordance with a particular precision bearing used, which adds minimal, if any, tolerance build up to the overall locator apparatus 12.

Flat springs 52a and 52b are fixedly attached or fastened (i.e., sandwiched solidly) between opposite ends of the pivotal arm member 50 and corresponding first and second locator arm assemblies 30 and 32, respectively, using suitable fastening means, such as clamping plates and fasteners 63, 64, 65, and 66. Flat springs 52a and 52b are thus solidly located. Flat springs or shims 52a and 52b are preferably fabricated from flat high carbon spring stock, typically 0.010" thick by 0.50" wide (scaled appropriately for use with the particular precision slide used, such as Schneeburger Model No. ND3-105.60).

In accordance with the present invention, substrate 14 can be accurately located on the processing surface 16 between respective first and second mating engagement surfaces 44a and 44b as the surfaces are moved towards one another.

Further with respect to the embodiment as shown in FIGS. 2 and 3, a spring 60 having a desired tension is provided. Spring 60 is fastened between a raised block portion 36a of base 36 and the first locator arm 42a, by suitable means, such as shoulder screws 62. Spring 60 is used for exerting a pulling force F1 on the first locator arm 42a which is fastened to linear slide mechanism or slide 40a. The pulling force F1 causes the first locator arm 42a to be biased for movement in the direction of force F1, which further, also causes locator arm jaw 20a and mating engagement surface 44a to move in a "close$_1$" direction.

The first locator arm 42a is connected to pivotal arm member or block 50 at a first end 51a thereof by flat spring 52a, using a suitable clamp plate and fastener. An opposite end 51b of pivotal arm member 50 is connected to the second locator arm 42b by a similar flat spring 52b, using a suitable clamp plate and fastener. Pivotal arm member 50 is further free to rotate about a pivot point 38 using precision bearing 54.

The second locator arm 42b is fastened by suitable means to a linear stage of slide mechanism or slide 40b and is free to move with the linear stage of slide 40b. The spring pulling force F1 further causes pivotal arm member 50 to rotate counter clockwise (as indicated by the arrow marked CC in FIG. 2) resulting in the second locator arm 42b being biased for movement in an opposite direction of force F1, which further, also causes locator arm jaw 20b and mating engagement surface 44b to move in the "close$_2$" direction. Both locator arm jaws 20a and 20b converge on and clamp a typical substrate 14 when the pair of jaws are moving in the respective "close" direction. Pivotal arm member 50 is symmetrical by design so that any rotational motion will cause each locator arm jaw 20a and 20b to move uniformly in an opposite direction, either towards one another or away from one another. In other words, any movement of locator arm jaw 20a in a first translational direction will result in an equal movement of locator arm jaw 20b in an opposite translational direction.

To release or unclamp substrate 14, a force F2 (as shown by the arrow labeled F2 in FIG. 2) is applied by any suitable means. The magnitude force F2 is required, at a minimum, to be sufficient enough to cause pivotal arm member 50 to rotate clockwise, as noted in FIG. 2 by the arrow labeled "C", to thus move the pair of first and second locator jaws 20a and 20b, respectively, in an "open" direction. It is preferable that an "open" position correspond to a position of the jaws which is sufficient for the substrate to clear the outermost portion of the engagement surfaces of the respective jaws as the substrate is placed upon and/or removed from the nesting location on the processing surface 16.

Spring 60 provides a force of a sufficient tension to allow locator arm 42a on slide mechanism 40a to move to the right, into a position as shown in FIG. 2. As a result, the pivotal arm member 50 is pulled in a counter clockwise direction "CC" via the zero tolerance build up, solidly located connection flat spring 52a. The pivotal arm member 50 is allowed to rotate on it's central axis 38 by precision bearing 54. In conjunction with the rotation of pivotal arm member 50, flat spring 52b will pull locator arm 42b on slide mechanism 40b exactly the same distance as locator arm 42a moves on slide mechanism 40a in an opposite direction.

Figure 4:
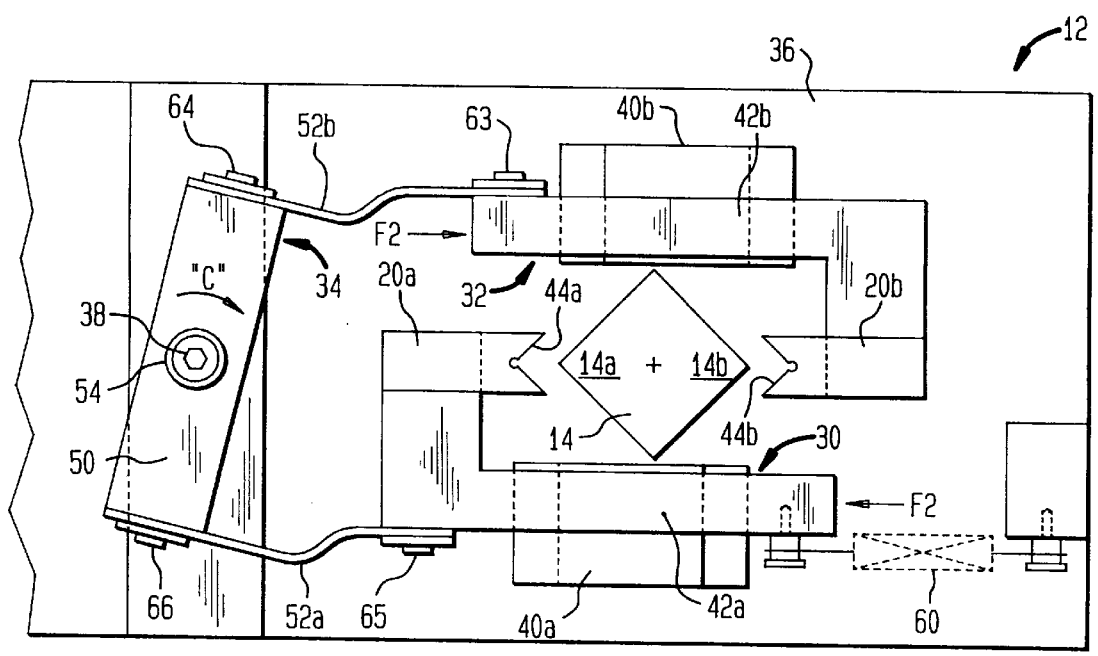
FIG. 4 shows a top view of the embodiment of the present invention as shown in FIG. 2 having mating engagement surfaces in an open position.

Referring now to FIG. 4, the motion can be reversed by applying a force F2 to the locator arm 42a on slide mechanism 40a in the opposite direction of F1 so as to counter act the tension force of spring 60. Alternatively, the force F2 may be applied to locator arm 42b on slide mechanism 40b to the right to create the same effect. Still further, spring 60 may be replaced by any suitable means which is configured to move and provide a first "opening" force and a second "closing" force necessary to actuate a locating and positioning operation of the locator apparatus of the present invention. As shown in FIG. 4, force F2 causes pivotal arm member 50 to rotate in a clockwise direction which further causes flat springs 52a and 52b to flex accordingly. As a result, a zero tolerance build-up, exact movement of jaws 20a and 20b is achieved.

The first and second locator jaws 20a and 20b are preferably part of a respective first and second locator arm 42a and 42b, and/or appropriately connected thereto. The flat springs 52A and 52B are mounted to respective locator arms 42a and 42b in such a way (with clamp plates 63, 64, 65, and 66) such that they perform like "living hinges". The flat springs 52A and 52B provide a zero tolerance and positioning repeatability. Any movement of one locator jaw will cause an identical movement of the other locator jaw in the opposite direction. For example, if pivotal arm member 50 is rotated counter clockwise a vary slight amount so as to cause locator jaw 20a to move 0.0001 inch towards the right, then locator jaw 20b would move exactly 0.0001 inch towards the left. The present invention is thus highly useful in automation controlled handling applications requiring accurate and repeatable positioning of substrates or workpieces.

As mentioned herein above, locator arm members 42a and 42b are mounted on slide mechanisms 40a and 40b, respectively, further wherein locator arm members 42a and 42b, include locator jaws 20a and 20b, respectively. Jaws 20a and 20b are used for locating and positioning a generally square substrate 14 precisely over, under, or between a particular substrate process station or stations, as the case may be. Locating and positioning of the substrates can be in preparation for purposes of testing, inspecting, and/or other applications, for example, wherein the applications may require the attaching of components precisely.

Rectangular parts may likewise be located and positioned with the locator apparatus of the present invention. In this later instance, the rectangular substrate or part can be clamped by off-setting a centerline $C_L$ of the V-shape notch of each of the jaws 20a and 20b to fit the profile of the part being clamped. In other words, the centerline $C_L$ of each V-otch of the jaws is off-set or displaced in a parallel manner a desired distance from one another. In the preferred embodiment, the centerline $C_L$ of each of the V-shaped notches of the jaws 20a and 20b are aligned and co-extensive.

The present invention thus provides a more accurate positioning system than prior known systems, and furthermore, the locator apparatus of the present invention is fabricated using a minimum of parts. The present invention further provides an overall much smaller package than prior known locator systems, thus reducing, for example, an amount of factory floor space required, and allowing a greater flexibility to the design of manufacturing and process equipment within the confines of the substrate locator.

Figure 5:
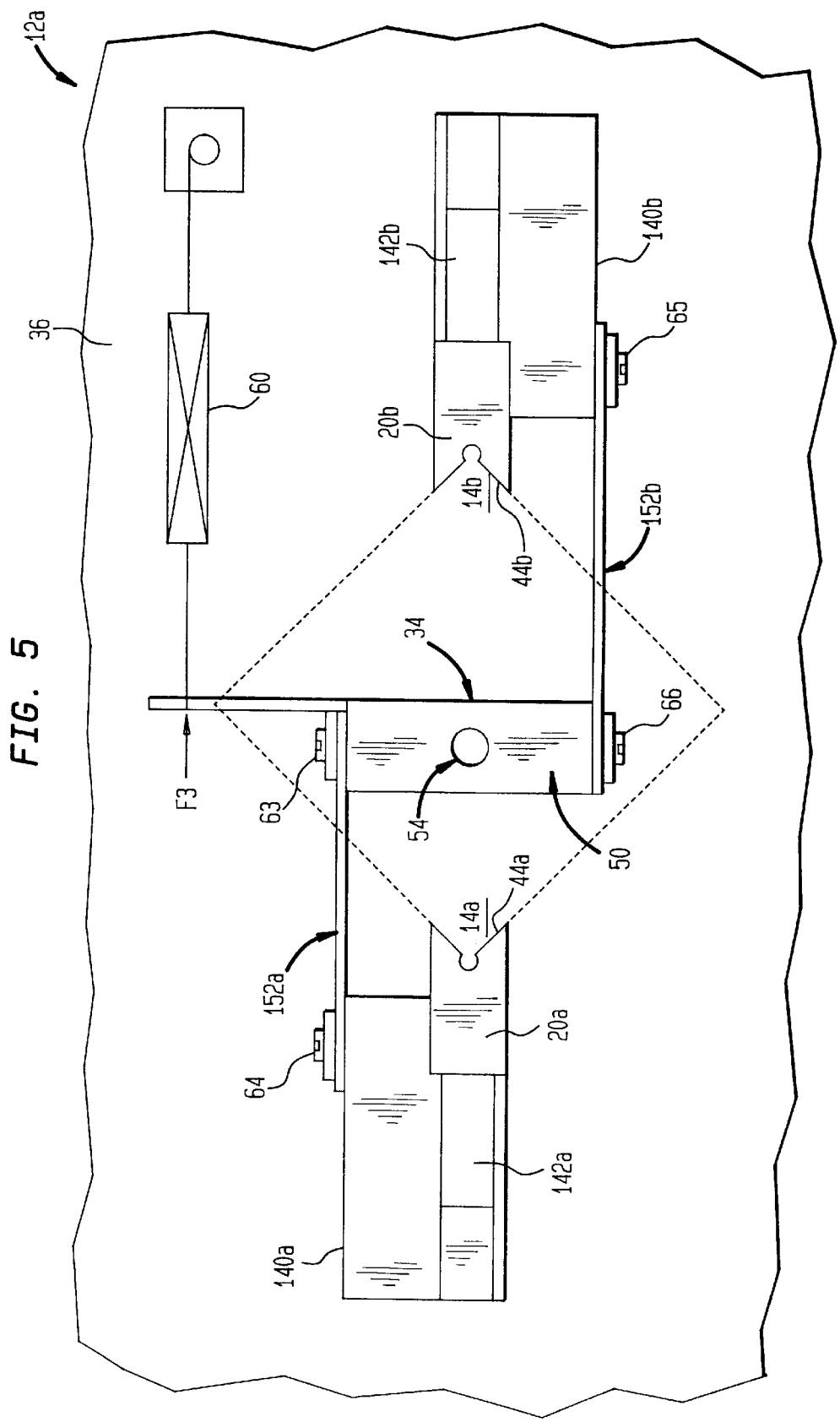
FIG. 5 illustrates an alternate embodiment of the present invention.
Figure 6:
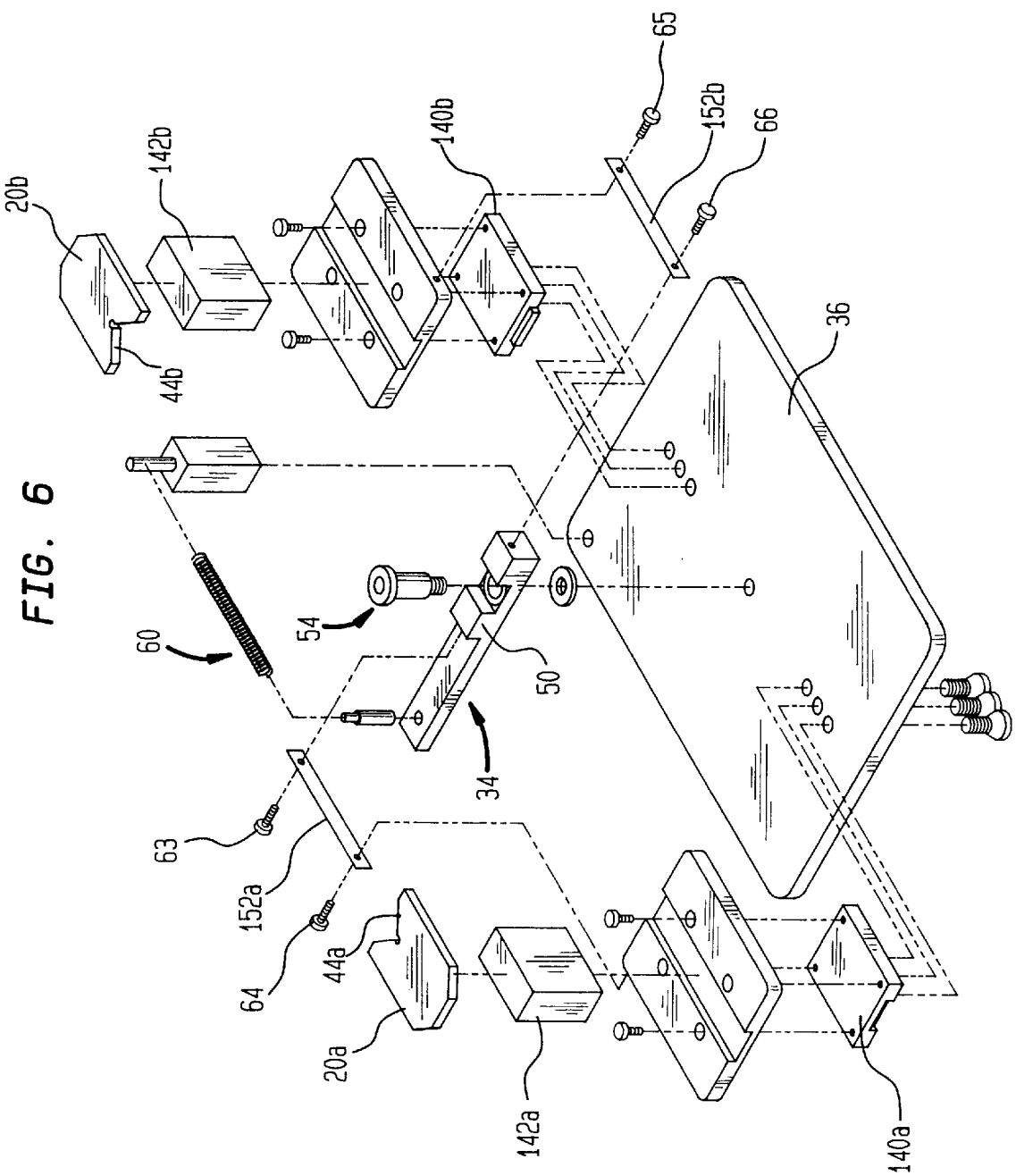
FIG. 6 illustrates an exploded perspective view of the alternate embodiment of FIG. 5.

Many configurations of the slide mechanism placement, with respect to the other slide mechanism, are possible to accomplish a similar effect. For example, in accordance with an alternate embodiment according to the present invention, as shown in FIGS. 5 and 6, the pivot means 34 is placed in between the slide mechanisms 140a and 140b. A force F3 is applied to the pivotal arm member 150 to keep flat springs 152a and 152b in tension. Force F3 can be provided, for example, by compression spring 60 attached between an extension off of pivot member 50 and mechanical ground, wherein flat springs 152a and 152b held in tension.

An advantage of the present invention is that the flat springs are solidly located to the pivotal arm member and the locator arms on the slide mechanisms, thus no tolerance buildup is realized between respective locator arm assemblies and the pivotal arm member. Effectively, an overall minimal or zero tolerance build up is obtained. Furthermore, the present invention provides an improved positioning accuracy with simplicity.

Yet another advantage of the present invention is that all components are in tension during a locating, positioning, and clamping process. The effect of having all components under tension during the clamping process is that it provides an equal and uniform force exerted on the clamped part with no chance of distortion due to deflection.

The present invention advantageously overcomes the problems encountered with current technology four-point locators, the later of which are comprised of many moving parts which leads to tolerance build-ups, inaccuracies and increased costs. The present invention is more accurate in locating and positioning of MLC substrates, as well as other workpieces, and further provides for overall reduced manufacturing costs.

With respect to the present invention, the jaws can locate and position square or round substrates or other workpieces. In accordance with the present invention, substrates are supported on an independent nest, corresponding to a portion of processing surface 16 (FIG. 1), wherein the nest is centered between the jaws. Locating a substrate over the true center of the nesting point exactly, regardless of the substrate's size, is accomplished with the locator apparatus of the present invention. With the locator apparatus of the present invention, the true center of the substrate is caused to overlay the true center of the nest. Furthermore, the present invention provides a positioning repeatability and accuracy on the order of less than 1 micron of true center for locating a substrate. The tolerance build up of the four points as discussed with respect to the related art is eliminated by the fixed ends of the flexing "shims" connection of the pivotal arm member and the locator arm members on the respective slide mechanisms. The solidly located flat spring feature, as discussed herein, guarantees the accurate repeatability.

Figure 7:
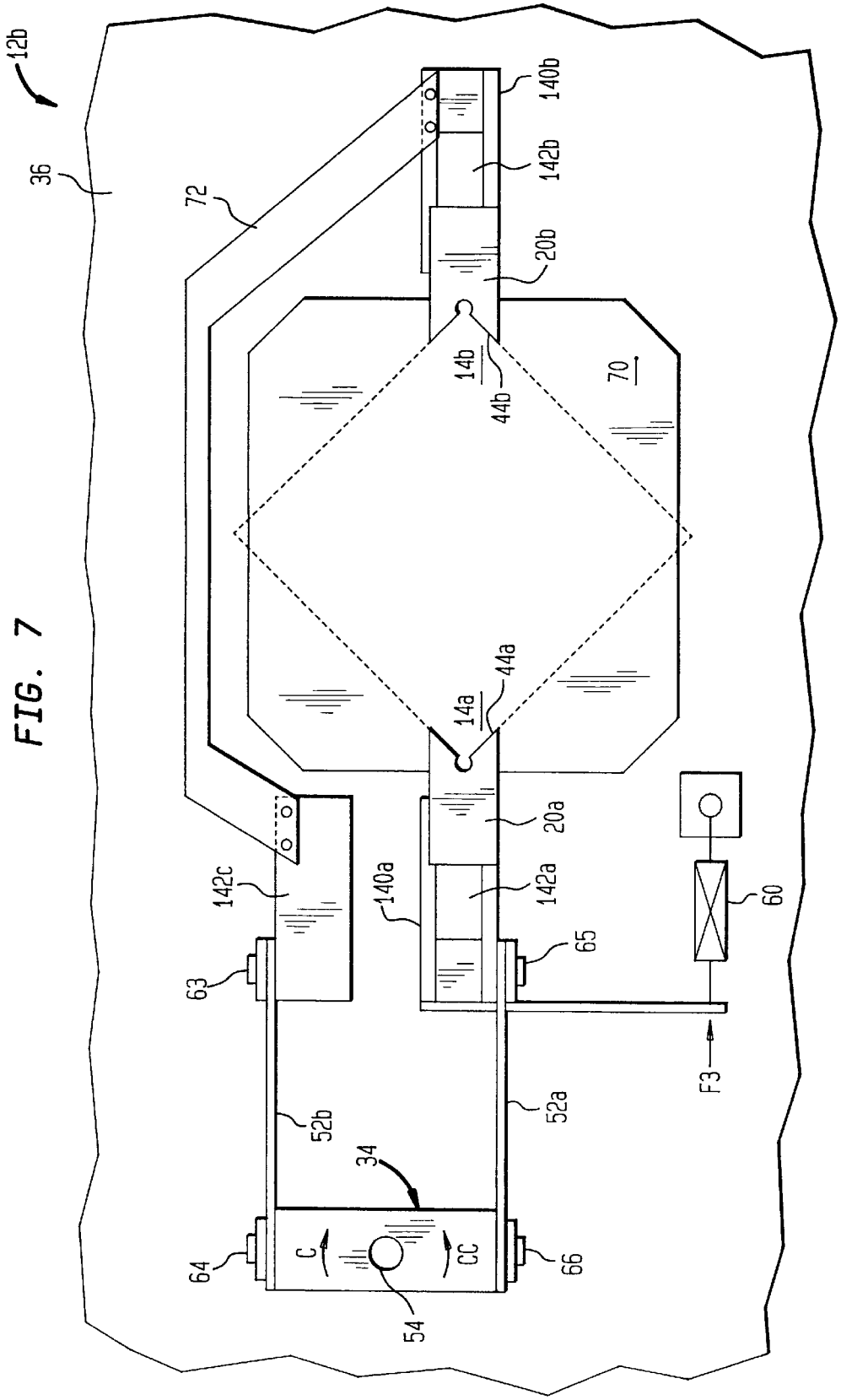
FIG. 7 illustrates yet another alternate embodiment according to the present invention.

Referring now to FIG. 7, an alternate embodiment according to the present invention is similar to the embodiment as shown with respect to FIGS. 2–4, with the following differences, wherein the alternate embodiment is suitable for the positioning and locating of relatively large substrates. The positioning, locating and clamping apparatus 12b includes an enlarged aperture 70 in base plate 36. Aperture 70 enables a probing from an underside of a substrate under test, when located and positioned with locator jaws 20a and 20b. Locator jaws 20a and 20b are mounted upon locator arm members 142a and 142b, respectively. In addition to precision slide mechanisms 142a and 142b, a third precision slide mechanism 142c is provided. An rigid extension bar member 72 is solidly connected between the stage of the third slide mechanism 142c and the stage of second slide mechanism 142b. Any movement of the stage of slide mechanism 142c is equally transferred to the stage of slide mechanism 142b.

Tension spring 60 provides a proper amount of tension for a substrate clamping force. Placement of the tension spring 60 is such that the flat springs are always maintained in tension when clamping a substrate or workpiece (as opposed to being in compression). When in tension, the flat springs are equal in geometry on both sides. In addition, when clamping a substrate, it is preferred to have the flat springs be in a is generally flat position. However, when the flat springs are in compression, one flat spring may be weaker than the other, thus resulting in a non-uniform deflection or spring action. When opening up the locator jaws to insert a substrate there between, the flat springs can bend and flex in accordance with appropriate pivotal movement of the pivot member, placing the flat springs under compression. In the absence of the spring force F3 provided by spring 60, when the flat springs are flat, the substrate is to fit within locator jaws with a tolerance on the order of a few thousandths of an inch to prevent any unnecessary bending on the flat springs themselves. Only when advanced in a forward closing position and tension is put onto the substrate, does the substrate become absolutely centered. The force exerted upon the substrate by the locator jaws is sufficient to hold the same in a desired vertical position during a testing operation.

The embodiment of the present invention as shown in FIG. 7 thus provides for the positioning, locating, and clamping of larger substrates. In addition, apparatus 12c is suitable for testing operations requiring the administration of process operations to the substrate from below and above.

According to the present invention, a method of locating a workpiece on a processing surface include s the steps of providing a first locator arm assembly having a first surface disposed for lateral movement and mating engagement with a first portion of the workpiece. A second locator arm assembly is provided, the second locator arm assembly having a second surface disposed for lateral movement parallel to the first surface. The second surface is further for mating engagement with a second, opposite side, portion of the workpiece. Lastly, a pivotal means is disposed for pivotal movement about a pivot point and symmetrically coupled, with a zero tolerance buildup, between the first locator arm assembly and the second locator arm assembly. The pivotal means is further provided for inducing an equal but opposite lateral movement in the first and second mating engagement surfaces of the first and second locator arm assemblies, respectively, whereby the workpiece is accurately located on the processing surface between respective first and second mating engagement surfaces as the surfaces are moved towards one another. The pivotal means further includes a pivotal arm member symmetrically coupled between the first locator arm assembly and the second locator arm assembly using flat springs solidly located between opposite ends of the pivotal arm member and corresponding first and second locator arm assemblies, respectively.

In one embodiment of the method of present invention, the first locator arm assembly includes a first linear slide mechanism having a first locator arm slidably mounted thereon. The first locator arm includes the first mating engagement surface. The second locator arm assembly includes a second linear slide mechanism having a second locator arm slidably mounted thereon, wherein the second locator arm including the second mating engagement surface. Furthermore, the pivotal means includes a pivotal arm member symmetrically coupled between the first locator arm assembly and the second locator arm assembly using flat springs solidly located between opposite ends of the pivotal arm member and corresponding first and second locator arm assemblies, respectively.

The method of the present invention further includes providing a base plate. In this instance, the first locator arm assembly includes a first linear slide mechanism having a base fixedly attached to the base plate. The first linear slide mechanism further includes a first locator arm slidably mounted thereon for lateral movement. The second locator arm assembly includes a second linear slide mechanism having a base fixedly attached to the base plate. The second linear slide mechanism further includes a second locator arm slidably mounted thereon for lateral movement.

Further in accordance with one embodiment according to the present invention, the first and second mating engagement surfaces each include a V-shape engagement surface. The V-shape engagement surface may further include a relief bore at the bottom of the V-shape for receiving a corner of the workpiece therein during a locating of the workpiece.

The method of locating a substrate or workpiece further includes disposing one of the first locator arm assembly, the second locator arm assembly, and the pivotal means between a first position and a second position, thereby effecting a movement of the first mating engagement surface and the second mating engagement surface between an open position and a closed position, respectively. Still further, the method includes spring biasing one of the first locator arm assembly, the second locator arm assembly, and the pivotal means in a manner for causing the first mating engagement surface and the second mating engagement surface to be displaced towards one another in a closed position in an absence of other outside biasing forces. Alternatively, the spring biasing of one of the first locator arm assembly, the second locator arm assembly, and the pivotal means can similarly be in a manner for causing the first mating engagement surface and the second mating engagement surface to be displaced away from one another in an open position in an absence of other outside biasing forces.

Still further, a substrate is located on a processing surface during a processing operation, by a method of providing a first locator arm assembly including a first linear slide mechanism having a first locator arm slidably mounted thereon. The first locator arm includes a first surface disposed for lateral movement and mating engagement with a first portion of the substrate. A second locator arm assembly including a second linear slide mechanism having a second locator arm slidably mounted thereon is provided, wherein the second locator arm includes a second surface disposed for lateral movement parallel to the first surface. The second surface is further for mating engagement with a second, opposite side, portion of the substrate. Lastly, a pivotal means is provided which is disposed for pivotal movement about a pivot point and symmetrically coupled, with a zero tolerance buildup, between the first locator arm assembly and the second locator arm assembly. The pivotal means is for inducing an equal but opposite lateral movement in the first and second mating engagement surfaces of the first and second locator arm assemblies, respectively. Furthermore, the pivotal means includes a pivotal arm member symmetrically coupled using flat springs solidly located between opposite ends of the pivotal arm member and corresponding first and second locator arm assemblies, respectively, whereby the substrate is accurately located on the processing surface between respective first and second mating engagement surfaces as the surfaces are moved towards one another.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention, as limited solely by the appended claims.

What is claimed is:

1. A method of locating a workpiece on a processing surface, said method comprising the steps of:

providing a first locator arm assembly having a first surface disposed for lateral movement and mating engagement with a first portion of the workpiece;

providing a second locator arm assembly having a second surface disposed for lateral movement parallel to the first surface, the second surface further for mating engagement with a second, opposite side, portion of the workpiece; and providing a pivotal means disposed for pivotal movement about a pivot point and symmetrically coupled, with a zero tolerance buildup, between the first locator arm assembly and the second locator arm assembly for inducing an equal but opposite lateral movement in the first and second mating engagement surfaces of the first and second locator arm assemblies, respectively, wherein said pivotal means includes a pivotal arm member symmetrically coupled using flat springs solidly located between opposite ends of the pivotal arm member and corresponding first and second locator arm assemblies, respectively whereby the workpiece is accurately located on the processing surface between respective first and second mating engagement surfaces as the surfaces are moved towards one another.

2. The method of claim 1, further comprising the steps of:

providing a base plate, further wherein the first locator arm assembly includes a first linear slide mechanism having a base fixedly attached to the base plate, the first linear slide mechanism further having a first locator arm slidably mounted thereon for lateral movement, the first locator arm including the first mating engagement surface; and the second locator arm assembly includes a second linear slide mechanism having a base fixedly attached to the base plate, the second linear slide mechanism further having a second locator arm slidably mounted thereon for lateral movement, the second locator arm including the second mating engagement surface.

3. The method of claim 1, wherein the first and second mating engagement surfaces each include a V-shape engagement surface.

4. The method of claim 3, further wherein the V-shape engagement surface includes a relief bore at the bottom of the V-shape for receiving a corner of the workpiece therein during a locating of the workpiece.

5. The method of claim 1, further comprising the step of:

disposing one of the first locator arm assembly, the second locator arm assembly, and the pivotal means between a first position and a second position, thereby effecting a movement of the first mating engagement surface and the second mating engagement surface between an open position and a closed position, respectively.

6. The method of claim 1, further comprising the step of:

spring biasing one of the first locator arm assembly, the second locator arm assembly, and the pivotal means in a manner for causing the first mating engagement surface and the second mating engagement surface to be displaced towards one another in a closed position in an absence of other outside biasing forces.

7. The method of claim 1, further comprising the step of:

spring biasing one of the first locator arm assembly, the second locator arm assembly, and the pivotal means in a manner for causing the first mating engagement surface and the second mating engagement surface to be displaced away from one another in an open position in an absence of other outside biasing forces.

8. A method of locating a substrate on a processing surface during a processing operation, said method comprising the steps of:

providing a first locator arm assembly including a first linear slide mechanism having a first locator arm slidably mounted thereon, the first locator arm having a first surface disposed for lateral movement and mating engagement with a first portion of the substrate;

providing a second locator arm assembly including a second linear slide mechanism having a second locator arm slidably mounted thereon, the second locator arm having a second surface disposed for lateral movement parallel to the first surface, the second surface further for mating engagement with a second, opposite side, portion of the substrate; and providing a pivotal means disposed for pivotal movement about a pivot point and symmetrically coupled, with a zero tolerance buildup, between the first locator arm assembly and the second locator arm assembly for inducing an equal but opposite lateral movement in the first and second mating engagement surfaces of the first and second locator arm assemblies, respectively, wherein the pivotal means includes a pivotal arm member symmetrically coupled using flat springs solidly located between opposite ends of the pivotal arm member and corresponding first and second locator arm assemblies, respectively, whereby the substrate is accurately located on the processing surface between respective first and second mating engagement surfaces as the surfaces are moved towards one another.

* * * * *